(12) United States Patent
Chen

(10) Patent No.: US 9,439,318 B2
(45) Date of Patent: Sep. 6, 2016

(54) ELECTRICAL RECEPTACLE CONTROLLER

(71) Applicant: Liang Light Chen, Los Gatos, CA (US)

(72) Inventor: Liang Light Chen, Los Gatos, CA (US)

( * ) Notice: Subject to any disclaimer, the term of this patent is extended or adjusted under 35 U.S.C. 154(b) by 57 days.

(21) Appl. No.: 14/604,646

(22) Filed: Jan. 23, 2015

(65) Prior Publication Data

US 2016/0219741 A1    Jul. 28, 2016

(51) Int. Cl.

| | | |
|---|---|---|
| *H01R 9/00* | (2006.01) | |
| *H05K 7/10* | (2006.01) | |
| *H01R 13/66* | (2006.01) | |
| *H01R 13/703* | (2006.01) | |
| *H01R 13/717* | (2006.01) | |
| *H01R 25/00* | (2006.01) | |

(52) U.S. Cl.
CPC ........ *H05K 7/1015* (2013.01); *H01R 13/6691* (2013.01); *H01R 13/703* (2013.01); *H01R 13/717* (2013.01); *H01R 25/006* (2013.01)

(58) Field of Classification Search
USPC .......................... 361/772, 760, 773; 439/107
See application file for complete search history.

(56) References Cited

U.S. PATENT DOCUMENTS

2003/0092297 A1* 5/2003 Reindle ................. H01R 31/02
439/107

* cited by examiner

*Primary Examiner* — Andargie M Aychillhum
(74) *Attorney, Agent, or Firm* — Douglas L. Weller

(57) ABSTRACT

A circuit board is used with a duplex receptacle electrical outlet. The circuit includes a first connecting pole configured for placement within a first wire reception hole of the duplex receptacle electrical outlet. The first wire reception hole is in electrical contact with a hot wire connection of the duplex receptacle electrical outlet. A second connecting pole is configured for placement within a second wire reception hole of the duplex receptacle electrical outlet. The second wire reception hole is in electrical contact with a neutral wire connection of the duplex receptacle electrical outlet. A control circuit is connected to the first connecting pole and the second connecting pole.

10 Claims, 6 Drawing Sheets

US 9,439,318 B2

ELECTRICAL RECEPTACLE CONTROLLER

BACKGROUND

Electrical receptacles are widely used to provide power in residential and commercial buildings. In the United States, electrical receptacles are usually rated for 125 volts alternating current (VAC) or 250 VAC. The voltages are approximate as actual voltages may typically vary a few volts without affecting operation of devices that receive power from electrical receptacles. The Occupational Safety and Health Administration (OSHA) maintains a list of approved testing laboratories that are approved to perform safety testing. One of the best known is safety consulting and certification company Underwriter Laboratories (UL). UL has participated in the public adoption of electricity and the drafting of safety standards for electrical devices and components, including electrical receptacle. Obtaining UL certification for electrical receptacles and complying with building codes can be costly process for a small company with limited means.

DESCRIPTION OF THE EMBODIMENT

Figure 1:
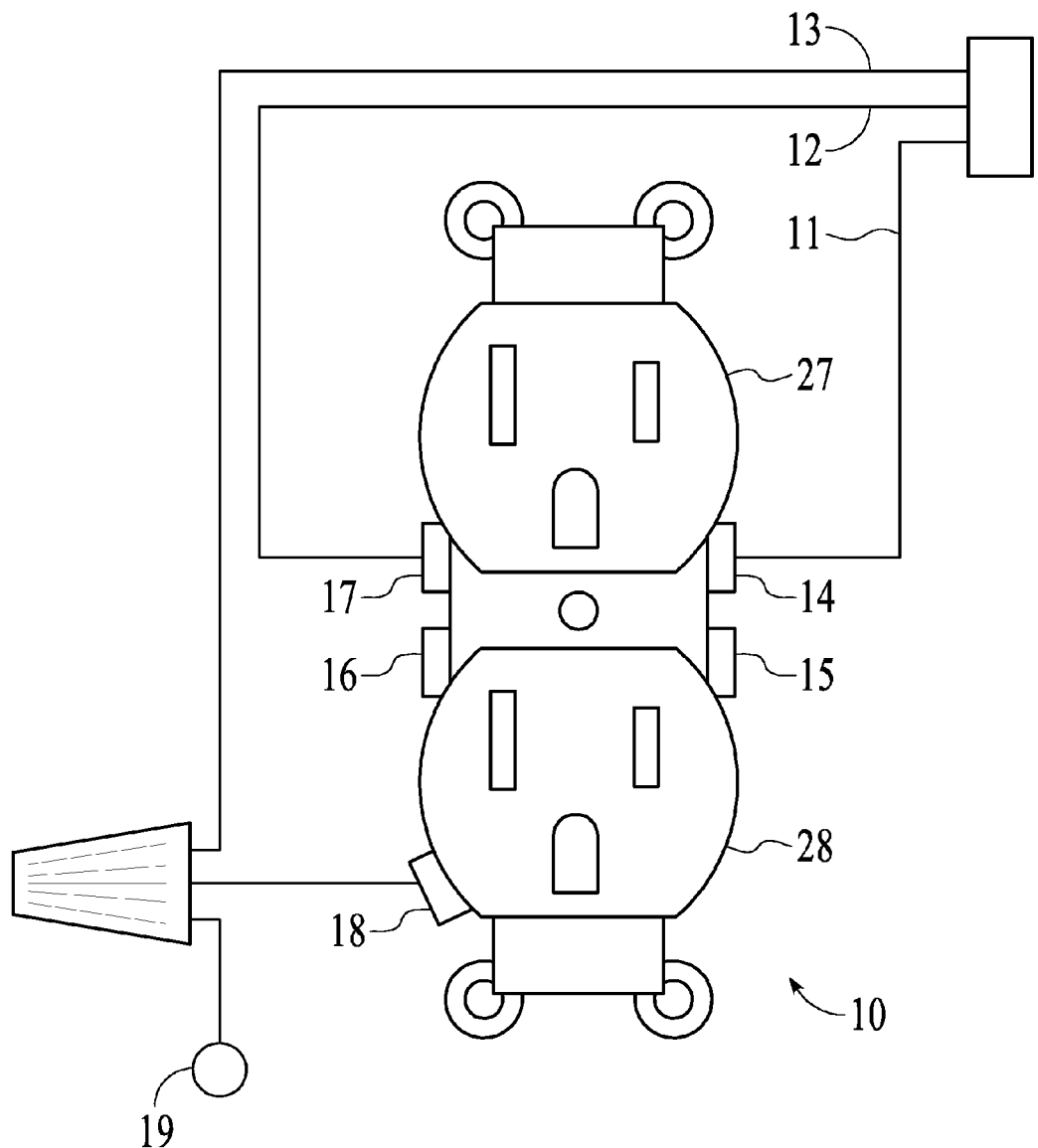
FIG. 1, FIG. 2 and FIG. 3 show various views of a UL certified 125 volt duplex receptacle electrical outlet in accordance with the prior art.

FIG. 1 shows a front view of a duplex receptacle electrical outlet 10. For example, duplex receptacle electrical outlet 10 is a UL certified 125 volt duplex receptacle electrical outlet. Duplex receptacle electrical outlet 10 includes a hot wire connection 14 connected to a hot wire 11. A hot wire connection 15 may be connected to hot wire connection 14 or connected to a separate hot wire. Hot wire connection 14 provides power to a power receptacle 27 and hot wire connection 15 provides power to a power receptacle 28. Duplex receptacle electrical outlet 10 also includes a neutral wire connection 17 connected to a neutral wire 12. A neutral wire connection 16 may be connected to neutral wire connection 17 or connected to a separate neutral wire. Duplex receptacle electrical outlet 10 also includes a ground wire connection 18 connected to a ground wire 13 and a ground 19. A hot wire connection 16 may be connected to neutral wire connection 17 or connected to a separate neutral wire.

Figure 2:
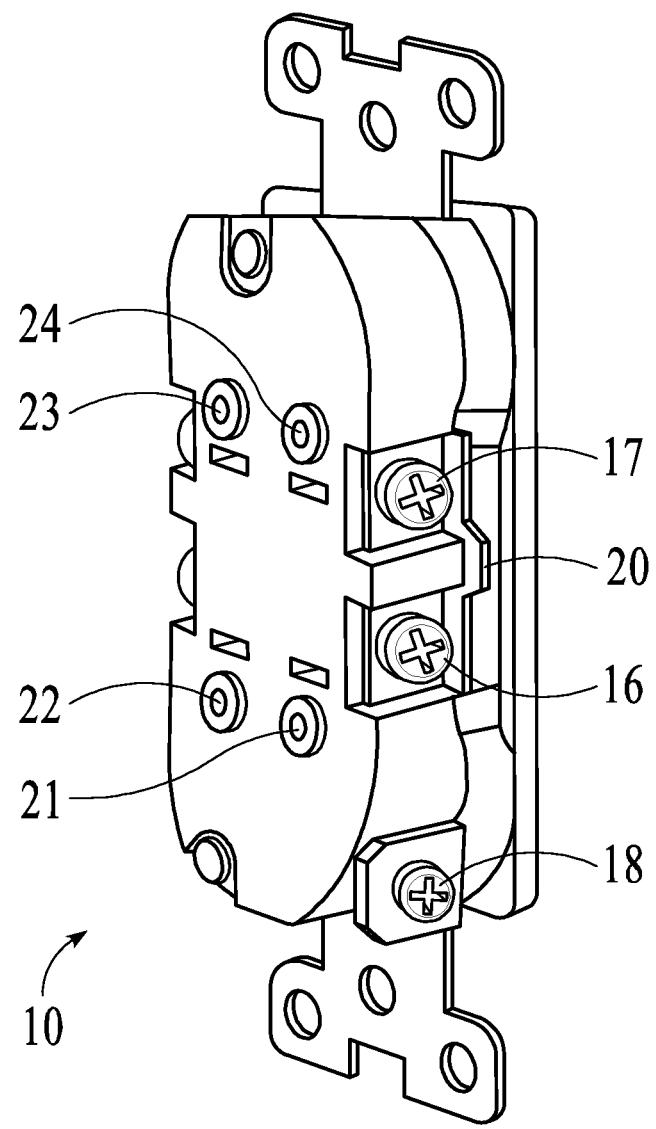

FIG. 2 shows another view of duplex receptacle electrical outlet 10 where a back side of duplex receptacle electrical outlet 10 is shown to include a wire reception hole 21, a wire reception hole 22, a wire reception hole 23 and a wire reception hole 24. For example, wire reception hole 21 is electrically connected to neutral wire connection 16, wire reception hole 22 is electrically connected to hot wire connection 15, wire reception hole 23 is electrically connected to hot wire connection 14, wire reception hole 24 is electrically connected to neutral wire connection 17. A connector 20 is shown to be intact connecting neutral wire connection 16 to neutral wire connection 17.

Figure 3:
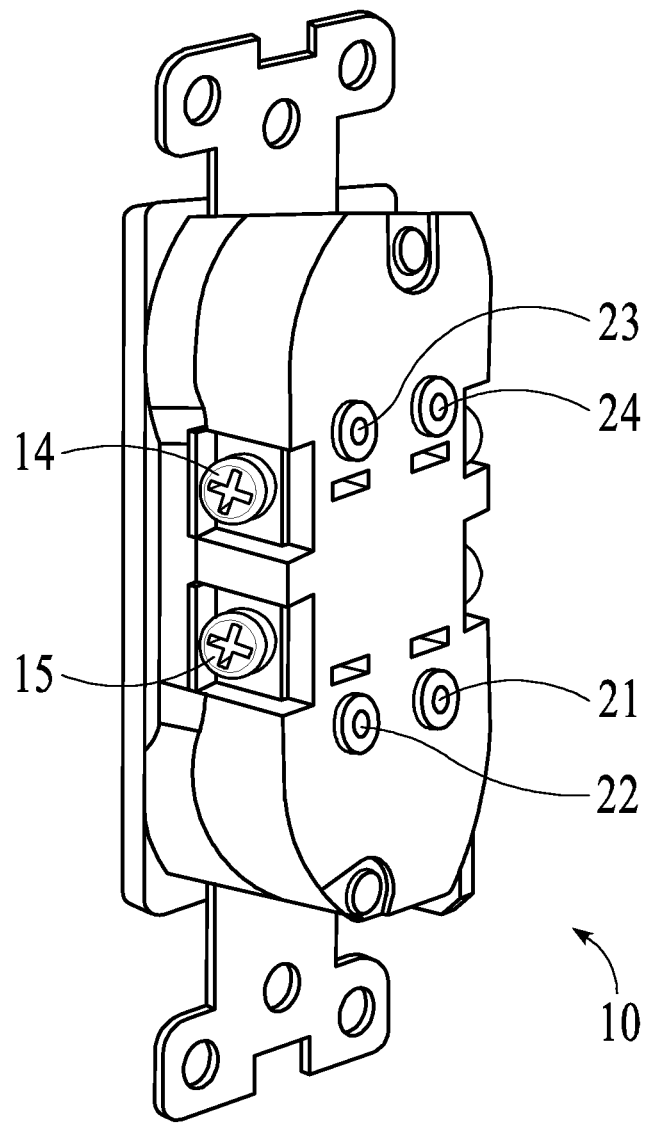

FIG. 3 shows another view of duplex receptacle electrical outlet 10. From FIG. 3 it can be seen that there is no intact connector connecting hot connection 14 to hot wire connection 15.

Figure 4:
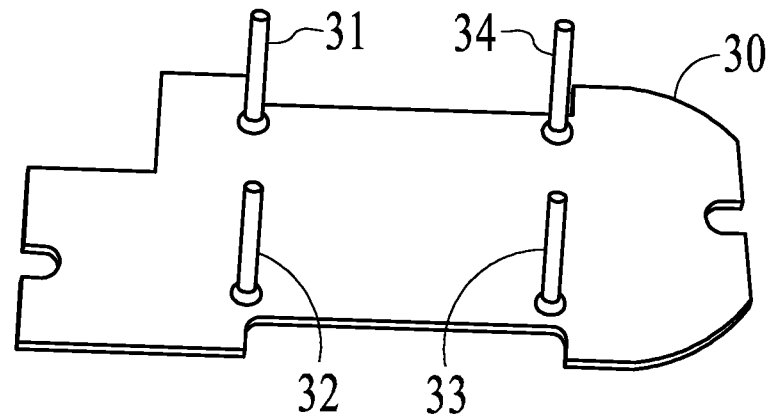
FIG. 4 and FIG. 5 show various views of a controller circuit board in accordance with an embodiment of the present invention.

FIG. 4 shows the underside of a controller circuit board 30 shaped to fit to the backside of duplex receptacle electrical outlet 10. A connecting pole 31 is shaped and located to fit within wire reception hole 21. A connecting pole 32 is shaped and located to fit within wire reception hole 22. A connecting pole 33 is shaped and located to fit within wire reception hole 23. A connecting pole 34 is shaped and located to fit within wire reception hole 24.

Figure 5:
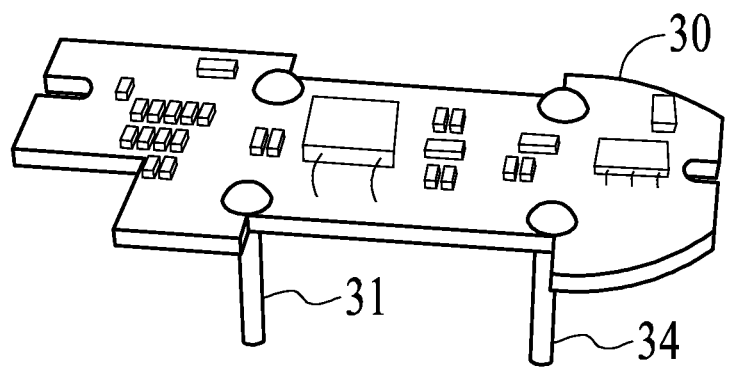

FIG. 5 shows a top side of controller circuit board 30. The exact circuitry on controller circuit board 30 varies depending upon the desired function and application of controller circuit board 30.

Figure 6:
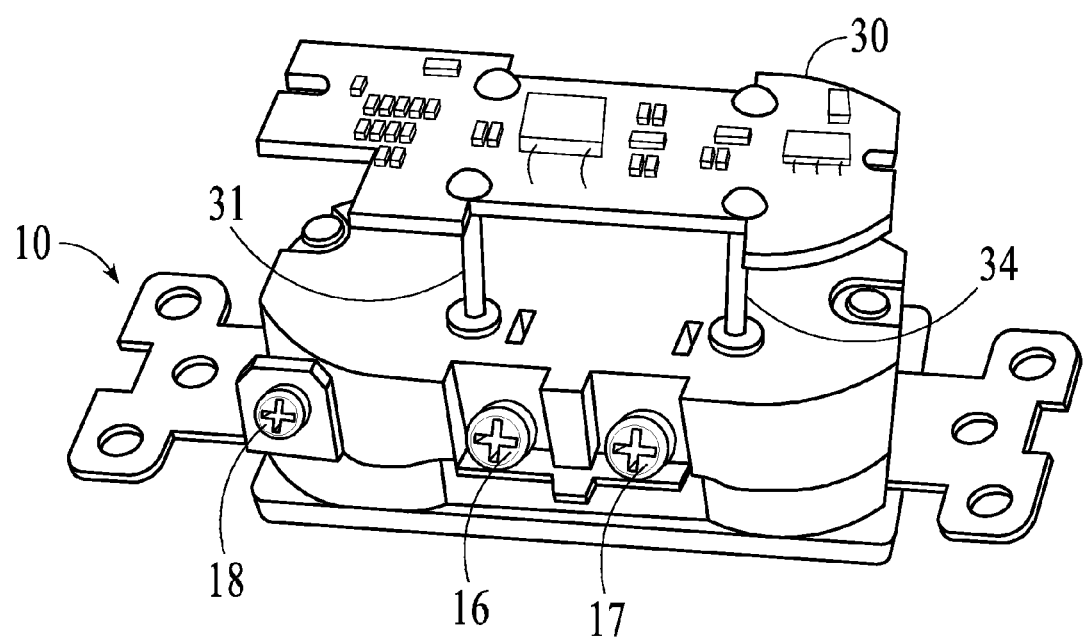
FIG. 6 shows a controller circuit board being mounted on a duplex receptacle electrical outlet in accordance with an embodiment of the present invention.

FIG. 6 shows controller circuit board 30 in place to be mounted on duplex receptacle electrical outlet 10. When from this position controller circuit board 30 is pressed down onto the back side of duplex receptacle electrical outlet 10, connecting pole 31 will lock within wire reception hole 21, connecting pole 32 will lock within wire reception hole 22, connecting pole 33 will lock within wire reception hole 23 and connecting pole 34 will lock within wire reception hole 24.

Figure 7:
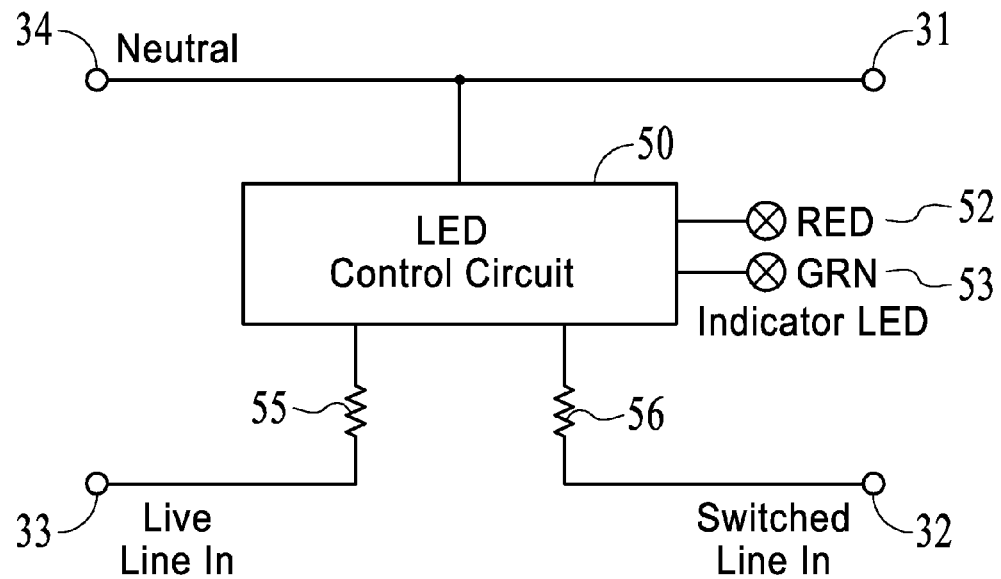
FIG. 7 shows a simplified schematic of a controller circuit board in accordance with an embodiment of the present invention.

FIG. 7 shows a simplified schematic of a controller circuit board 30, where controller circuit board 30 is configured to provide an intelligent status indication. A light emitting diode (LED) control circuit 50 within controller circuit board 30 is connected jointly to connecting pole 31 and connecting pole 34. LED control circuit 50 is connected through a resistor 55 to connecting pole 33. LED control circuit 50 is connected through a resistor 56 to connecting pole 32. For example, connecting pole 33 is connected to hot wire connection 14 that is a continuous live connection to power. For example, connecting pole 32 is connected to hot wire connection 15 that is a switched live connection to power. A status LED 52 and a status LED 53 indicate status of hot wire connection 14 and hot wire connection 15. Status LED 52 and status LED 53 serve as a status light, controlled by LED control circuit 50, that indicates whether duplex receptacle electrical outlet 10 is operating properly. For example, LED 53 is a green LED which when lit indicates both power receptacle 27 and power receptacle 28 on outlet 10 are powered. LED 52 is a red LED which when lit indicates only power receptacle 27 is connected to power while power receptacle 28 has no power. If both LED 52 and LED 53 do not light up, this indicates a failure in connection of duplex receptacle electrical outlet 10.

Figure 8:
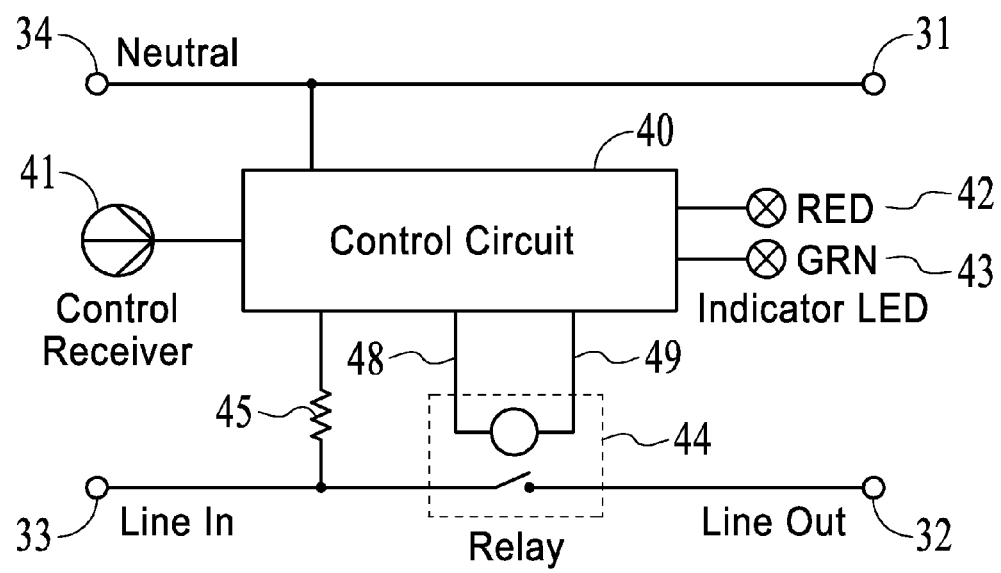
FIG. 8 shows another simplified schematic of a controller circuit board in accordance with an embodiment of the present invention.

FIG. 8 shows an alternative simplified schematic of a controller circuit board 30, where controller circuit board 30 is configured to provide intelligent switching between connecting pole 32 and connecting pole 33. A wired or wireless control circuit 40 within controller circuit board 30 is connected jointly to connecting pole 31 and connecting pole 34. Wired or wireless control circuit 40 is connected through a resistor 45 to connecting pole 33. For example, connecting pole 33 is connected to hot wire connection 14 that is a continuous live connection to power. For example, connecting pole 32 is connected to hot wire connection 15 that is connected to a relay 44 of controller circuit board 30. Relay 44, through a connection 48 and a connection 49, is controlled by wired or wireless control circuit 40. Wired or wireless control circuit 40, through connection 48 and connection 49, controls relay 44 to either connect or disconnect connecting pole 32 to connecting pole 33. When relay 44 connects connecting pole 32 to connecting pole 33, power is available at power receptacle 28 (shown in FIG. 1). When relay 44 disconnects connecting pole 32 from connecting pole 33, there is no power available at power receptacle 28. Regardless of whether relay 44 connects or disconnects connecting pole 32 and connecting pole 33 power is available at power receptacle 27, so long as power is available through hot wire 14.

Status lights may also be present. For example, a status LED 42 and a status LED 43 indicate status of hot wire connection 14 and hot wire connection 15. For example, LED 43 is a green LED which when lit indicates both power receptacle 27 and power receptacle 28 on outlet 10 are powered. LED 42 is a red LED which when lit indicates only power receptacle 27 has connected to power while power receptacle 28 has no power. If LED 42 and LED 53 both do not light up, it indicates a failure in connection of duplex receptacle electrical outlet 10. Status LED 42 and status LED 43, controlled by control circuit 40, indicate whether duplex receptacle electrical outlet 10 is operating properly.

A control receiver 41 signal wireless transmissions used by wired or wireless control circuit 40. For example, control receiver 41 receives local area Wi-Fi signals in accordance with the Institute of Electrical and Electronics Engineers' (IEEE) 801.11 standards. Alternatively, control receiver 41 receives wireless signals in accordance with Bluetooth wireless communication technology. Alternatively, control receiver 41 receives infrared signals. Control receiver 41 transfers wireless communication received to wired or wireless control circuit 40. For example, the wireless communication provides instructions to control relay 44.

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. A circuit board for use with a duplex receptacle electrical outlet, the duplex receptacle electrical outlet having a first power receptacle and a second power receptacle, the circuit board comprising:
   a first connecting pole configured for placement within a first wire reception hole of the duplex receptacle electrical outlet, the first wire reception hole being in electrical contact with the first power receptacle of the duplex receptacle electrical outlet, wherein the first wire reception hole is on a different side of the duplex receptacle electrical outlet than is the first power receptacle;
   a second connecting pole configured for placement within a second wire reception hole of the duplex receptacle electrical outlet, the second wire reception hole being in electrical contact with the second power receptacle of the duplex receptacle electrical outlet, wherein the second wire reception hole is on a different side of the duplex receptacle electrical outlet than is the second power receptacle;
   a relay connected between the first connecting pole and the second connecting pole, wherein the relay, in response to a control signal, electrically connects or disconnects the first connecting pole and the second connecting pole;
   a control circuit that generates the control signal; and,
   a receiver, connected to the control circuit that receives communication for the control circuit;
   wherein when circuit board is mounted on the duplex receptacle electrical outlet, the circuit does not cover the first power receptacle or the second power receptacle.

2. A circuit board as in claim 1, additionally comprising:
   a status light, controlled by the control circuit, that indicates whether the duplex receptacle electrical outlet is functional.

3. A circuit board for use with a duplex receptacle electrical outlet, the duplex receptacle electrical outlet having a first power receptacle and a second power receptacle, the circuit board comprising:
   a first connecting pole configured for placement within a first wire reception hole of the duplex receptacle electrical outlet, the first wire reception hole being in electrical contact with a hot wire connection of the duplex receptacle electrical outlet, wherein the first wire reception hole is on a different side of the duplex receptacle electrical outlet than is the first power receptacle;
   a second connecting pole configured for placement within a second wire reception hole of the duplex receptacle electrical outlet, the second wire reception hole being in electrical contact with a neutral wire connection of the duplex receptacle electrical outlet, wherein the second wire reception hole is on a different side of the duplex receptacle electrical outlet than is the first power receptacle;
   a control circuit connected to the first connecting pole and the second connecting pole; and,
   a status light, controlled by the control circuit, that indicates whether the duplex receptacle electrical outlet is functional;
   wherein the circuit board is adapted to be mounted on the duplex receptacle electrical outlet without covering the first power receptacle or the second power receptacle.

4. A circuit board as in claim 3, additionally comprising:
   a third connecting pole configured for placement within a third wire reception hole of the duplex receptacle electrical outlet, the second wire reception hole being in electrical contact with a second hot wire connection of the duplex receptacle electrical outlet; and,
   a relay connected between the first connecting pole and the third connecting pole, wherein the relay, in response to a control signal from the control circuit, electrically connects or disconnects the first connecting pole and the third connecting pole.

5. A circuit board as in claim 4, additionally comprising:
   a wireless receiver, connected to the control circuit that receives wireless communication for the control circuit.

6. A circuit board as in claim 3, additionally comprising:
   a wireless receiver, connected to the control circuit that receives wireless communication for the control circuit.

7. A circuit board for use with a duplex receptacle electrical outlet, the duplex receptacle electrical outlet having a first power receptacle and a second power receptacle, the circuit board comprising:
   a first connecting pole configured for placement within a first wire reception hole of the duplex receptacle electrical outlet, the first wire reception hole being in electrical contact with a hot wire connection of the duplex receptacle electrical outlet, wherein the first wire reception hole is on a different side of the duplex receptacle electrical outlet than is the first power receptacle;
a second connecting pole configured for placement within a second wire reception hole of the duplex receptacle electrical outlet, the second wire reception hole being in electrical contact with a neutral wire connection of the duplex receptacle electrical outlet, wherein the second wire reception hole is on a different side of the duplex receptacle electrical outlet than is the first power receptacle;
a control circuit connected to the first connecting pole and the second connecting pole; and,
a wireless receiver, connected to the control circuit that receives wireless communication for the control circuit;
wherein the circuit board is adapted to be mounted on the duplex receptacle electrical outlet without covering the first power receptacle or the second power receptacle.

8. A circuit board as in claim 7, additionally comprising:
a third connecting pole configured for placement within a third wire reception hole of the duplex receptacle electrical outlet, the second wire reception hole being in electrical contact with a second hot wire connection of the duplex receptacle electrical outlet; and,
a relay connected between the first connecting pole and the third connecting pole, wherein the relay, in response to a control signal from the control circuit, electrically connects or disconnects the first connecting pole and the third connecting pole.

9. A circuit board as in claim 8, additionally comprising:
a status light, controlled by the control circuit, that indicates whether the duplex receptacle electrical outlet is functional.

10. A circuit board as in claim 7, additionally comprising:
a status light, controlled by the control circuit, that indicates whether the duplex receptacle electrical outlet is functional.

\* \* \* \* \*